United States Patent [19]

Idei et al.

[11] Patent Number: 5,958,579
[45] Date of Patent: *Sep. 28, 1999

[54] INK JET RECORDING SHEET

[75] Inventors: Koji Idei; Yoshihiko Hibino; Junichi Soga, all of Chiyoda-ku, Japan

[73] Assignee: Mitsubishi Paper Mills Limited, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/654,677

[22] Filed: May 29, 1996

[30] Foreign Application Priority Data

| May 31, 1995 | [JP] | Japan | 7-133384 |
| Oct. 31, 1995 | [JP] | Japan | 7-283277 |
| Nov. 22, 1995 | [JP] | Japan | 7-304560 |
| Feb. 22, 1996 | [JP] | Japan | 8-034656 |

[51] Int. Cl.$^6$ ............................................. B41M 5/00
[52] U.S. Cl. ........................... 428/342; 428/195; 428/211
[58] Field of Search ...................... 428/341, 195, 428/211, 411.1, 342, 340

[56] References Cited

U.S. PATENT DOCUMENTS

| 4,576,867 | 3/1986 | Miyamoto . | |
| 5,124,201 | 6/1992 | Kurabayashi et al. . | |
| 5,178,944 | 1/1993 | Horiuchi et al. | 428/341 |
| 5,213,873 | 5/1993 | Yasuda et al. | 428/195 |
| 5,320,897 | 6/1994 | Kondo et al. | 428/195 |
| 5,496,634 | 3/1996 | Ogawa et al. | 428/341 |

FOREIGN PATENT DOCUMENTS

| 0 164 196 | 12/1985 | European Pat. Off. . |
| 0 602 326 | 6/1994 | European Pat. Off. . |
| 0 602 400 | 6/1994 | European Pat. Off. . |
| 0 609 930 | 8/1994 | European Pat. Off. . |
| 0 627 324 | 12/1994 | European Pat. Off. . |
| 0 673 779 | 9/1995 | European Pat. Off. . |
| 55-150396 | 11/1980 | Japan . |
| 60-260377 | 12/1985 | Japan . |
| 61-16884 | 1/1986 | Japan . |

OTHER PUBLICATIONS

Database WPI, Derwent Publications, AN 86–098055, JP–A–61 043 593, Mar. 3, 1986.

*Primary Examiner*—Pamela R. Schwartz
*Attorney, Agent, or Firm*—Oblon, Spivak, McClelland, Maier & Neustadt, P.C.

[57] ABSTRACT

An ink jet recording sheet to be used for a high speed rotary ink jet printing system employing an auxiliary drying device of a dielectric heating type, said sheet comprising a support and a cationic resin attached to the support.

16 Claims, No Drawings

INK JET RECORDING SHEET

The present invention relates to an ink jet recording sheet provided with water resistance of image, useful for an ink jet recording system wherein a water soluble ink is used for recording. More particularly, it relates to an ink jet recording sheet provided with water resistance of image, which is a plain paper type ink jet recording sheet useful for a high speed rotary ink jet printing system provided with a drying apparatus employing a dielectric heating system as an auxiliary drying device, whereby the ink setting property of the portion printed at a high speed is excellent, the PCS value of a printed image is high, and the bar code readability is also excellent.

The ink jet recording system is a system wherein fine droplets of ink are jetted by various operational principles and deposited on a recording sheet such as a paper sheet to form a record of images or letters. By virtue of its excellent characteristics such as high speed, low noise, easiness to produce multi-color images, applicability to a wide variety of record patterns and unnecessity of development or fixation, it has found a wide range of applications in various recording apparatus for figures including Chinese characters and for color images. Further, images formed by a multi-color ink jet system are capable of providing a record which is comparable to multi-color printed images by a printing plate system or negative images by a color photographic system. Still further, when only a small number of prints are required, the ink jet recording system is inexpensive as compared with the photography, and it is being widely used also in the full color image recording field.

Further, a rotary type high speed ink jet printing system has recently been developed and is being used also for an on-demand printing system such as address printing, customer information printing, numbering printing or bar code printing, at a high speed of at least 150 m/min. For such an application, a recording sheet having an excellent ink setting property, bar code readability and water resistance of image, is required.

Namely, such a recording sheet is required to have a sufficient ink setting property even when used in a rotary type high speed ink jet printing system with a printing speed of at least 150 m/min provided with an auxiliary drying device and at the same time have a high PCS (print contrast signal) value in a certain specific wavelength region and a bar code readability. Further, it is required that the ink dye will not run even under a high humidity condition or even if the printed portion is exposed to water for some reason (water resistance of image), and even in such a case, it is required that the above-mentioned bar code readability is maintained.

Ink jet recording sheets are generally classified into a so-called plain paper type represented by wood free paper or bond paper, and a coated paper type having an ink-receiving layer provided on a support such as a paper sheet, a synthetic paper sheet or a synthetic resin film.

The coated paper type includes an ink jet recording sheet of a low coating amount type having a coating amount of the ink-receiving layer of from about 1 to 10 $g/m^2$, a sheet of an intermediate coating amount type having a coating amount of from about 10 to 20 $g/m^2$ and a sheet of a high coating amount type having a coating amount of at least 20 $g/m^2$.

In recent years, the plain paper type is preferred from the viewpoint of both appearance and handling efficiency. However, with plain paper type ink jet recording sheets, the image density is usually low as compared with the coated paper type, and no adequate water resistance of image has been attained.

Some methods have been proposed to improve the water resistance of dyes. For example, Japanese Unexamined Patent Publication No. 150396/1980 discloses a method for improving the water resistance by forming a chelate with a dye in a water-soluble ink. Further, in order to improve the water resistance and the light resistance of a dye, Japanese Unexamined Patent Publication No. 260377/1985 discloses an example of an ink jet recording sheet containing cationic colloidal silica, Japanese Unexamined Patent Publication No. 16884/1986 discloses an example of an ink jet recording sheet containing a basic polyaluminum hydroxide compound, and U.S. Pat. No. 4,576,867 discloses an example of an ink jet recording sheet characterized by containing a basic oligomer.

However, it is known that even by employing these methods, the water resistance of image substantially deteriorates if sizing of the recording sheet is increased to improve the PCS value or the image quality (feathering).

Further, to improve the fixing property of ink, U.S. Pat. No. 5,124,201 proposes to define the roughness index and absorption coefficient according to the Bristow test. However, in this U.S. Patent, printing at such a high speed as intended by the present invention is not considered or assumed, and by such a method, the ink setting property can not be maintained.

As described above, in the case of conventional plain paper type ink jet recording sheets, no consideration has been made for a rotary high speed ink jet printing system with a printing speed of at least 150 m/min equipped with an auxiliary drying device, and no adequate water resistance of image or ink setting property has been obtained. Further, if the sizing of the recording sheet is increased to improve the PCS value or the image quality (feathering), the water resistance of image further deteriorates.

The object of the present invention is to fulfill the following objectives when plain type ink jet recording sheets are used for recording by a rotary ink jet printing system with a printing speed of at least 150 m/min equipped with a drying apparatus employing a dielectric heating system as an auxiliary drying device:

1. The ink setting property of the printed portion is good.
2. The PCS value is high, and the bar code readability is good.
3. Even in a high humidity atmosphere or even when water drops are deposited, the water resistance of image is good, the change in the PCS value is little, and the bar code readability is maintained.

In view of the above objectives, the present inventors have conducted an extensive research and as a result have invented an ink jet recording sheet which is excellent in the bar code readability and the ink setting property of the printed portion and which is excellent in the bar code readability even if the recorded image is exposed to water, by attaching a cationic resin to a support, using precipitated calcium carbonate light as a filler, adjusting the ash content of the sheet to a level of at least 7% as measured by a method in accordance with JIS P8128 except that the incineration temperature is 500° C., adjusting the absorption coefficient according to the Bristow test to a level of at least 1.07 $(ml/m^2 \cdot ms^{1/2})$ and increasing the PCS value of the printed image in a certain specific wavelength region.

Namely, in a first aspect, the present invention provides an ink jet recording sheet to be used for a high speed rotary ink jet printing system employing an auxiliary drying device of a dielectric heating type, said sheet comprising a support and a cationic resin attached to the support.

The cationic resin is attached preferably in an amount of from 0.2 to 2.0 $g/m^2$.

It is preferred that precipitated calcium carbonate light is used as a filler, and the ash content of the sheet is adjusted to a level of at least 7% as measured by a method in accordance with JIS P8128 except that the incineration temperature is 500° C.

The PCS value of a printed image at a wavelength of from 600 to 700 nm is preferably at least 0.80.

The absorption coefficient according to the Bristow test is preferably at least 1.07 (ml/m$^2$•ms$^{1/2}$).

The cationic resin is preferably at least one member selected from the group consisting of a dimethylamine/epichlorohydrin polycondensation product, an acrylamide/diallylamine copolymer, a polyvinyl amine copolymer, and a compound composed mainly of dicyandiamide and dimethyldiallyl ammonium chloride.

It is further preferred that the cationic resin is attached to the support by a size press or a gate roll coater installed in a paper machine.

In a second aspect, the present invention provides an ink jet recording sheet to be used for a high speed rotary ink jet printing system employing an auxiliary drying device of a dielectric heating type, said sheet comprising a support and a cationic resin attached to the support, and having an absorption coefficient according to the Bristow test of from 1.07 to 1.90 (ml/m$^2$•ms$^{1/2}$).

The cationic resin is attached preferably in an amount of from 0.2 to 2.0 g/m$^2$.

It is preferred that precipitated calcium carbonate light is used as a filler, and the ash content of the sheet is at least 7% as measured by a method in accordance with JIS P8128 except that the incineration temperature is 500° C.

The PCS value of a printed image at a wavelength of from 600 to 700 nm is preferably at least 0.80.

The cationic resin is preferably at least one member selected from the group consisting of a dimethylamine/epichlorohydrin polycondensation product, an acrylamide/diallylamine copolymer, a polyvinyl amine copolymer, and a compound composed mainly of dicyandiamide and dimethyldiallyl ammonium chloride.

It is further preferred that the cationic resin is attached to the support by a size press or a gate roll coater installed in the paper machine.

In a third aspect, the present invention provides an ink jet recording sheet to be used for a high speed rotary ink jet printing system employing an auxiliary drying device of a dielectric heating type, said sheet comprising a support and a cationic resin attached to the support, and having an absorption coefficient according to the Bristow test of from 1.07 to 1.90 (ml/m$^2$•ms$^{1/2}$), and a printed image of the sheet having a PCS value of a least 0.85 at a wavelength of from 600 to 700 nm.

The cationic resin is attached preferably in amount of from 0.2 to 2.0 g/m$^2$.

It is preferred that precipitated calcium carbonate light is used as a filler, and the ash content of the sheet is at least 7% as measured by a method in accordance with JIS P8128 except that the incineration temperature is 500° C.

The cationic resin is preferably at least one member selected from the group consisting of a dimethylamine/epichlorohydrin polycondensation product, an acrylamide/diallylamine copolymer, a polyvinyl amine copolymer, and a compound composed mainly of dicyandiamide and dimethyldiallyl ammonium chloride.

It is further preferred that the cationic resin is attached to the support by a size press or a gate roll coater installed in a paper machine.

In a fourth aspect, the present invention provides an ink jet recording sheet to be used for a high speed rotary ink jet printing system employing an auxiliary drying device of a dielectric heating type, said sheet comprising a support and a cationic resin attached to the support, and having an absorption coefficient according to the Bristow test of from 1.07 to 1.90 (ml/m$^2$•ms$^{1/2}$), and a printed image of the sheet having a PCS value of a least 0.85 at a wavelength of from 600 to 700 nm, wherein the cationic resin is attached to both sides of the support by a size press, a gate roll coater or a pre-metering transfer roll coater installed in the paper machine.

The cationic resin is attached preferably in an amount of from 0.2 to 2.0 g/m$^2$.

It is preferred that precipitated calcium carbonate light is used as a filler, and the ash content of the sheet is at least 7% as measured by a method in accordance with JIS P8128 except that the incineration temperature is 500° C.

Now, the ink jet recording sheet of the present invention will be described in detail.

The ink jet recording sheet of the present invention is a sheet of plain paper type wherein the support is used as the main ink-receiving layer, and wherein the ink-receiving layer component and the physical properties are specified.

The ink jet recording sheet according to the first aspect of the present invention is a sheet of a plain paper type wherein the support is used as the main ink-receiving layer and wherein the ink-receiving layer component and the physical properties are specified, and it is specifically intended for use in a high speed rotary ink jet printing system employing an auxiliary drying device of a dielectric heating type.

In the present invention, as the auxiliary drying device for the high speed rotary ink jet printing system is preferably a dielectric heating drier such as a high frequency heating drier or a microwave heating drier. In the high speed rotary ink jet printing system to be used in the present invention, the solvent for ink is water, and the difference in dielectric constant between paper and water is large. Accordingly, the dielectric heating system can be regarded as a drying system which has excellent drying efficiency and which is less influential over the paper. An infrared ray drying device or a hot air drying device may be mentioned as a common drying system, but such a drying system is of a high energy consumption type and requires a large installation area. Further, the paper will also be heat-dried. Thus, such a common method is inferior from the viewpoint of the efficiency.

It is evident that to improve the water resistance of an image formed by a water-soluble ink containing a direct dye or an acid dye used for an ink jet recording system, fixing of the dye by a reaction of an anion moiety of the dye with a cationic substance and water resistance treatment are effective. Further, from the viewpoint of improving the PCS value or the image quality (feathering), it is desired to increase the sizing of the recording sheet. However, if the sizing is increased too much, the ink is likely to flood without being absorbed by the recording sheet, and such a sheet will not be useful as an ink jet recording sheet. It is further known that even if the sizing is increased to such an extent not to cause ink flooding, the water resistance of image tends to deteriorate as the sizing is improved. The reason for deterioration of the water resistance of image with improvement of the sizing is considered to be such that the dye in the printed ink tends to remain on the paper surface rather than in the interior of the paper layer.

In the present invention, a method of attaching the following cationic resin is preferred as a method for imparting the water resistance of image.

The cationic resin to be used in the present invention is a monomer, oligomer or polymer, preferably an oligomer or polymer, of a primary to tertiary amine or a quaternary ammonium salt, which exhibits a cationic nature upon dissociation when dissolved in water. It has been found that excellent water resistance of image can be obtained especially when the cationic resin is at least one member selected from the group consisting of a dimethylamine/epichlorohydrin polycondensation product, an acrylamide/diallylamine copolymer, a polyvinyl amine copolymer, and a compound composed mainly of dicyandiamide and dimethyldiallyl ammonium chloride.

The dry attaching amount of the cationic resin is preferably within a range of from 0.2 to 2.0 g/m$^2$. If the amount is less than this range, no adequate water resistance of image tends to be obtained. The amount may be larger than this range, but no further improvement in the water resistance of image will thereby be obtained. Accordingly, use of such an excess amount is not desirable from the viewpoint of the costs and the appearance which departs from plain paper as the amount increases beyond the above range.

The cationic resin may be attached by means of various coating machines such as a size press, a gate roll coater, a pre-metering transfer roll coater, a blade coater, a rod coater, an air knife coater or a curtain coater. However, from the viewpoint of the cost and capability of treating both sides of paper by one step, it is preferred to attach the cationic resin by a size press, a gate roll coater or a pre-metering transfer roll coater installed in the paper machine.

Further, as a means to improve the water resistance of the printed portion in the present invention, it is preferred to use precipitated calcium carbonate light as a filler, and the ash content of the sheet is adjusted to be at least 7% as measured by a method in accordance with JIS P8128 except that the incineration temperature is 500° C. If the ash content is less than this range, absorption of the ink tends to be slow, and the setting property and the water resistance of the printed portion tend to be impaired.

With respect to the type of the filler to be used for the support of the present invention, calcium carbonate may be used, since it is useful in a neutral to weakly alkaline region where the color development of ink is good.

From the viewpoint of the above-mentioned ink absorptivity, precipitated calcium carbonate light is preferred. Further, as white pigments, conventional pigments may be used in combination. Such white pigments include, for example, white inorganic pigments such as heavy calcium carbonate, kaolin, clay, talc, calcium sulfate, barium sulfate, titanium dioxide, zinc oxide, zinc sulfide, zinc carbonate, satin white, aluminum silicate, diatomaceous earth, calcium silicate, magnesium silicate, synthetic silica, aluminum hydroxide, alumina, lithopone, zeolite, magnesium carbonate and magnesium hydroxide, and organic pigments such as a styrene-type plastic pigment, an acrylic plastic pigment, a polyethylene, microcapsules, a urea resin and a melamine resin.

In the present invention, in order to maintain the ink setting property excellent even when solid printing is carried out at a printing speed of 150 m/min by means of an auxiliary drying device, the absorption coefficient as measured by a liquid absorption test method of the Bristow test as disclosed in J. TAPPI No. 51-87, is preferably at least 1.07 (ml/m$^2 \cdot$ms$^{1/2}$) and at most 1.90 (ml/m$^2 \cdot$ms$^{1/2}$). If the absorption coefficient of the paper is less than this range, the ink will not adequately be absorbed by the paper, and the non-absorbed ink will be transferred to the roll in contact with the printed portion or to the non-printed portion at the time of winding up, whereby the printed product will be stained. If the absorption coefficient of the paper exceeds this range, the ink setting property will be excellent, but the water absorptivity of the paper tends to be too much, whereby the strength upon absorption of water will be low, and paper breakage during printing is likely to occur.

The absorption coefficient by the Bristow test can be controlled by adjusting the amount of an incorporated sizing agent such as a rosin sizing agent, an alkenyl succinic anhydride, an alkyl ketene dimer or a petroleum resin sizing agent. Further, a surface sizing agent may also be employed in combination with the cationic resin by means of e.g. a size press or a gate roll coater. Further, it can also be controlled by moderating the condition for beating or adjusting the density of the base paper or the amount of the incorporated filler.

The surface sizing agent to be used in combination with the cationic resin may, for example, be a styrene/acrylic acid type polymer, a styrene/methacrylic acid type polymer, an acrylonitrile/vinyl formal/acrylate copolymer, a styrene/maleic acid type copolymer or a surface sizing agent of AKD type or rosin type. However, a cationic surface sizing agent is preferred with a view to mixing with the cationic resin.

Further, a binder may be used, if necessary, together with the cationic resin and the surface sizing agent. The binder may, for example, be oxidized starch, starch esterified by phosphoric acid, optionally modified starch, cationic starch or various modified starches, polyethylene oxide, polyacrylamide, sodium polyacrylate, sodium arginate, hydroxymethylcellulose, methylcellulose, polyvinyl alcohol, or their derivatives. Such binders may be used alone or in combination as a mixture.

The support of the ink jet recording sheet of the present invention may, for example, be paper composed mainly of wood fibers, sheet material such as a non-woven fabric composed mainly of wood fibers or synthetic fibers, or a cellulose formed from microorganisms, which is so-called bacteria cellulose. A wood pulp to be used for the paper may, for example, be NBKP, LBKP, NBSP, LBSP, GP, TMP or a waste paper pulp. These pulps may be used alone or in combination as a mixture.

Materials for the waste paper pulp useful in the present invention include those shown in the waste paper standard quality list compiled by Paper Recycling Promotion Center, such as Kamijiro, Kakejiro, cream white, card, Tokujiro, Chujiro, Mozou, Irojiro, kent, white art, Tokujogiri, Betsujogiri, newspapers and magazines. More specifically, information-related papers such as non-coated computer papers, printer papers such as heat sensitive papers or pressure sensitive papers, office appliance waste papers such as PPC papers., waste papers or boards, for example, coated papers such as art papers, coat papers, fine coat papers or matte papers, or non-coated papers such as woodfree papers, color woodfree papers, notebook papers, letter papers, packaging papers, fancy papers, intermediate quality papers, newspapers, ground wood papers, super calender papers, simili papers, pure white roll papers or milk cartons, chemical pulp papers, or ground wood pulp-containing papers, may, for example, be used. However, the useful materials are not particularly limited irrespective of whether they are printed, non printed, copied or marked.

In the present invention, other additives such as a pigment dispersant, a thickener, a fluidity-improving agent, a defoaming agent, a foam-suppressing agent, a release agent, a blowing agent, a penetrating agent, a coloring dye, a coloring pigment, a fluorescent brightener, an ultraviolet absorber, an antioxidant, a preservative, an ash-preventing agent, a water proofing agent, a wet-strength agent and a dry strength agent, may be suitably incorporated to the paper material within a range not to impair the desired effects of the present invention.

In a paper making method for the ink jet recording sheet of the present invention, the paper machine may be a conventional paper machine which is commonly known in the paper making industry, such as a Fourdrinier paper machine, a twin wire paper machine, a combination paper machine, a cylinder paper machine or a yankee paper machine.

The ink jet recording sheet according to the second aspect of the present invention is a plain paper type sheet wherein the support is used as the main ink-receiving layer, and it is characterized in that the ink-receiving layer component is specified, and the absorption coefficient of the ink jet recording sheet according to the Bristow test is within a certain specific range.

The absorption coefficient of the ink jet recording sheet of the present invention as measured by a liquid absorption test method of the Bristow test as disclosed in J. TAPPI No. 51-87, is within a range of from 1.07 to 1.90 (ml/m$^2$•ms$^{1/2}$). In an ink jet printing system of the type wherein ink dots are continuously jetted at a printing speed of 150 m/min, the solvent for ink is mainly water not to clog the orifice having a diameter of about 30 μm.

Accordingly, in order to maintain the ink setting property even in solid printing, the liquid absorption coefficient of the support according to the Bristow test is substantially influential. If the absorption coefficient is less than 1.07 (ml/m$^2$•ms$^{1/2}$), even if an auxiliary drying device is employed, the ink will not be absorbed and will stain the roll in contact with the sheet and will finally stain also the non-printed portion of the sheet. On the other hand, if the absorption coefficient exceeds 1.90 (ml/m$^2$•ms$^{1/2}$), almost all ink will be absorbed in the support before being dried by the auxiliary drying device, whereby the printed image density tends to be low, and paper strength depending on the hydrogen bond tends to be substantially low, whereby the paper is likely to break under a tension exerted to the sheet during printing.

The absorption coefficient according to the Bristow test depends on the sizing of the support. Accordingly, as a method for controlling the absorption coefficient, a method may be mentioned wherein the amount of the incorporated sizing agent such as a rosin type sizing agent, an alkenyl succinic anhydride, an alkyl ketene dimer or a petroleum resin type sizing agent is adjusted to increase or reduce the hydrophobic groups. However, fine adjustment may be difficult only by controlling the amount of the incorporated sizing agent, and in such a case, it is possible to employ a surface sizing agent in combination with the cationic resin by means of a size press or a gate roll coater. Further, as a method for physically changing the penetration of a solvent into the support, adjustment may be made also by moderating the condition for beating pulp fibers or controlling the base sheet density or the amount of the incorporated filler.

The surface sizing agent to be used in combination with the cationic resin may, for example, be a styrene/acrylic acid type polymer, a styrene/methacrylic acid type polymer, an acrylonitrile/vinyl formal/acrylate copolymer, a styrene/maleic acid type copolymer, or a surface sizing agent of AKD type or rosin type. With a view to mixing with the cationic resin, a cationic surface sizing agent is preferred.

The ink jet recording sheet according to the third aspect of the present invention is a plain paper type sheet wherein the support is used as the main ink-receiving layer, and it is characterized in that the ink-receiving layer component and the absorption coefficient of the ink jet recording sheet are specified, and the PCS value of a printed image at a wavelength of from 600 to 700 nm is specified.

The rotary high speed ink jet printing system has been used for an on-demand printing application such as address printing, customer information printing, numbering printing or bar code printing. As a feature in application of the ink jet printing system, it may be mentioned that printing can be carried out easily irrespective of whether the bar code printing is horizontal or vertical.

Namely, as the recording sheet, it is important that the PCS value in a certain specific wavelength region is high, the bar code readability is good, the ink dye will not flow out (water resistance of image) even under a high humidity condition or even when the printed portion is exposed to water for some reason. Further, even in such a case, the above bar code readability can be maintained.

The wavelength commonly used in bar code reading devices is from 600 to 700 nm in many cases, and it is considered that so long as the PCS value within this wavelength region is at least 0.85, a reading error is negligible. Accordingly, with the sheet of the present invention, the readability and water resistance property are optimum, and the sheet will be useful also outdoors.

The ink jet recording sheet according to the fourth aspect of the present invention is a plain paper type sheet wherein the support is used as the main ink-receiving layer, and it is characterized in that the ink-receiving layer component, the absorption coefficient of the ink jet recording sheet and the PCS value of a printed image at a wavelength of from 600 to 700 nm are specified, and a production method for readily imparting the printability on both sides is specified.

As a method for attaching the cationic resin, coating by means of various coating machines may be possible. However, coating on one side only is possible at a time by a coating machine such as a blade coater, a rod coater, an air knife coater or a curtain coater. Accordingly, both sides can not be treated by one step, and to coat on both sides to provide printability on both sides, it is necessary to provide two heads i.e. one head for each of the front and rear sides. Otherwise, with one head, two operations are required for treatment of both sides, whereby the productivity is poor.

Whereas, by means of the size press, gate roll coater and pre-metering transfer roll coater installed in the paper machine as specified in the present invention, it is possible to attach the cationic resin on both sides of paper by one step, whereby from the viewpoint of the cost, the productivity can be remarkably improved.

The ink jet recording sheet of the present invention may be used not only as an ink jet recording sheet but also as any recording sheet of the type to be used for recording with a liquid ink. For example, it may be an image-receiving sheet for heat transfer recording of the type, whereby an ink sheet having a heat meltable ink containing e.g. a heat meltable substance, a dye or pigment, etc. as the main components, coated on a thin support such as, a resin film, a high density paper or a synthetic paper, is heated from its rear side to melt and transfer the ink to the image-receiving sheet, an ink jet recording sheet of the type to which a heat meltable ink which has been melted on heating is jetted in the form of fine droplets for recording, or an image-receiving sheet corresponding to a photo- and pressure-sensitive donor sheet employing microcapsules containing a photo-polymerizable monomer and a colorless or color dye or pigment.

A common feature of these recording sheets is that the ink is in a liquid state at the time of recording. A liquid ink will penetrate or diffuse in the depth direction or horizontal direction of the ink-receiving layer of the recording sheet before hardening, immobilizing or fixing. The above-mentioned various recording sheets require absorptivity suitable for the respective systems, and the ink jet recording sheet of the present invention may be used as any of the above-mentioned various recording sheets.

Further, the ink jet recording sheet of the present invention may be used as a recording sheet for the electrographic recording system which is employed in many copying machines and printers, to which sheet a toner is fixed on heating.

Now, the effects of the present invention will be described.

Firstly, the ink jet recording sheet of the present invention comprises a support and a cationic resin attached thereto, and is preferably an ink jet recording sheet wherein the attaching amount of the cationic resin is from 0.2 to 2.0 g/m$^2$ as a dry attaching amount, and precipitated calcium carbonate light is used as a filler and the ash content of the sheet is at least 7% as measured by a method in accordance with JIS P8128 except that the incineration temperature is 500° C., more preferably an ink jet recording sheet wherein the absorption coefficient according to the Bristow test is at least 1.07 (ml/m$^2$•ms$^{1/2}$), and the PCS value of a printed image by a rotary ink jet printing system at a wavelength of from 600 to 700 nm is at least 0.80, whereby the ink setting property of a high speed printed portion and the bar code readability will be excellent, and the bar code readability can be maintained even when the printed image is exposed to water for some reason.

Secondly, the ink jet recording sheet of the present invention is an ink jet recording sheet comprising a support and a cationic resin attached thereto, whereby preferably, the attaching amount of the cationic resin is from 0.2 to 2.0 g/m$^2$ as a dry attaching amount, and precipitated calcium carbonate light is used as a filler and the ash content of the sheet is at least 7% as measured by a method in accordance with JIS P8128 except that the incineration temperature is 500° C., more preferably an ink jet recording sheet wherein the absorption coefficient according to the Bristow test is within a range of from 1.07 to 1.90 (ml/m$^2$•ms$^{1/2}$), and the PCS value of a printed image by a rotary ink jet printing system at a wavelength of from 600 to 700 nm is at least 0.80, whereby the ink setting property at a high speed printed portion is particularly excellent by the definition according to the Bristow test. Further, the bar code readability will be excellent, and the bar code readability can be maintained even when the printed image is exposed to water for some reason.

Thirdly, the ink jet recording sheet of the present invention is an ink jet recording sheet comprising a support and a cationic resin attached thereto, wherein preferably, the attaching amount of the cationic resin is from 0.2 to 2.0 g/m$^2$ as a dry attaching amount, and precipitated calcium carbonate light is used as a filler and the ash content of the sheet is at least 7% as measured by a method in accordance with JIS P8128 except that the incineration temperature is 500° C., more preferably an ink jet recording sheet wherein the absorption coefficient according to the Bristow test is within a range of from 1.07 to 1.90 (ml/m$^2$•ms$^{1/2}$), and the PCS value of a printed image by a rotary ink jet printing system at a wavelength of from 600 to 700 nm is at least 0.85, whereby the bar code readability is particularly excellent by the definition of the PCS value at a wavelength of from 600 to 700 nm. Further, the ink setting property at a high speed printed portion is also excellent. Furthermore, the bar code readability can be maintained even if the printed image is exposed to water for some reason.

Fourthly, the ink jet recording sheet of the present invention is an ink jet recording sheet comprising a support and a cationic resin attached thereto, wherein preferably, the attaching amount of the cationic resin is from 0.2 to 2.0 g/m$^2$ as a dry attaching amount, and precipitated calcium carbonate light is used as a filler and the ash content of the sheet is at least 7% as measured by a method in accordance with JIS P8128 except that the incineration temperature is 500° C., more preferably an ink jet recording sheet wherein the absorption coefficient according to the Bristow test is within a range of from 1.07 to 1.90 (ml/m$^2$•ms$^{1/2}$), and the PCS value of a printed image by a rotary ink jet printing system at a wavelength of from 600 to 700 nm is at least 0.85, and the cationic resin is coated by a size press installed in a paper machine, whereby the sheet is excellent in printability on both sides, and the bar code readability and the ink setting property of a high speed printed portion are also excellent. Further, the bar code readability can be maintained even if the printed image is exposed to water for some reason.

Now, the present invention will be described in further detail with reference to Examples. However, it should be understood that the present invention is by no means restricted to such specific Examples. Further, in the Examples, "parts" and "%" mean "parts by weight" and "% by weight", respectively, unless otherwise specified.

EXAMPLES 1 TO 8 AND COMPARATIVE EXAMPLES 1 TO 5

Preparation of support 1

Added to a pulp slurry comprising 80 parts of LBKP having a freeness of 400 ml csf and 20 parts of manifold white ledger deinked pulp having a freeness of 475 ml csf, were 15 parts of precipitated calcium carbonate light (TP-121, tradename, manufactured by Okutama Kogyo Co., Ltd.) as a filler, 0.8 part of amphoteric starch (Cato 3210, tradename, manufactured by National Starch and Chemical Co., Ltd.), 0.6 part of aluminum sulfate and 0.04 part of an alkyl ketene dimer type sizing agent (Sizepine K903, tradename, Arakawa Chemical Co., Ltd.), and the mixture was sheeted by a Fourdrinier paper machine to obtain Support 1 having a weight of 80 g/m$^2$.

Preparation of Support 2

Support 2 was prepared in the same manner as for Support 1 except that the amount of the alkyl ketene dimer type sizing agent for Support 1 was changed to 0.10 part.

EXAMPLE 1

Attached to Support 1 prepared as described above by means of a size press installed on machine, were a dimethylamine/epichlorohydrin polycondensation product (Polyfix 601, tradename, manufactured by Showa Highpolymer Co., Ltd.) as a cationic resin in an amount of 1.0 g/m$^2$ as a dry attaching amount and a starch esterified with phosphoric acid (MS#4600, tradename, manufactured by Nihon Shokuhin Kakou Co., Ltd.) in an amount of 1.5 g/m$^2$ per side as a dry attaching amount, followed by machine calender treatment, to obtain an ink jet recording sheet of Example 1.

EXAMPLE 2

An ink jet recording sheet of Example 2 was prepared in the same manner as in Example 1 except that Support 1 of Example 1 was changed to Support 2, and the dry attaching amount of the cationic resin was changed to 0.1 g/m$^2$.

EXAMPLE 3

An ink jet recording sheet of Example 3 was prepared in the same manner as in Example 2 except that the dry attaching amount of the cationic resin of Example 2 was changed to 0.2 g/m².

EXAMPLE 4

An ink jet recording sheet of Example 4 was prepared in the same manner as in Example 2 except that the dry attaching amount of the cationic resin of Example 2 was changed to 1.0 g/m².

EXAMPLE 5

An ink jet recording sheet of Example 5 was prepared in the same manner as in Example 2 except that the dry attaching amount of the cationic resin of Example 2 was changed to 2.0 g/m².

EXAMPLE 6

An ink jet recording sheet of Example 6 was prepared in the same manner as in Example 4 except that the cationic resin of Example 4 was changed to an acrylamide/diallylamine copolymer (Sumirez Resin 1001, tradename, manufactured by Shimitomo Chemical Co., Ltd.).

EXAMPLE 7

An ink jet recording sheet of Example 7 was prepared in the same manner as in Example 4 except that the cationic resin of Example 4 was changed to a polyvinyl amine copolymer (Himacs SC-700, tradename, manufactured by Hymo Co., Ltd.).

EXAMPLE 8

An ink jet recording sheet of Example 8 was prepared in the same manner as in Example 4 except that a styrene type cationic surface sizing agent (Basoplast 265D, tradename, manufactured by BASF) was added in an amount of 0.05% to the size press liquid of Example 4.

COMPARATIVE EXAMPLE 1

The same sheet as in Example 4 was prepared.

COMPARATIVE EXAMPLE 2

Attached to support 1 by means of a size press installed on machine, was a starch esterified with phosphoric acid (MS#4600, tradename, manufactured by Nihon Shokuhin Kakou Co., Ltd.) in an amount of 1.5 g/m² as a dry attaching amount, followed by machine calender treatment, to obtain an ink jet recording sheet of Comparative Example 2.

COMPARATIVE EXAMPLE 3

An ink jet recording sheet of Comparative Example 3 was prepared in the same manner as in Comparative Example 2 except that Support 1 of Comparative Example 2 was changed to Support 2.

COMPARATIVE EXAMPLE 4

Commercially available Mitsubishi OCR paper (72) was used. This commercial product had no cationic resin applied to the paper surface.

COMPARATIVE EXAMPLE 5

Commercially available Mitsubishi Diaform paper (70) was used. This commercial product had no cationic resin applied to the paper surface.

The properties of the sheets prepared as described above, are summarized in Table 1. Now, the printing and drying methods for the sheets prepared as described above, will be described. With respect to the ink jet recording sheets of Examples 1 to 8 and Comparative Examples 2 to 5, by means of a high speed rotary ink jet printing system S6240J manufactured by Uchida Yoko Co., Ltd, at printing speeds of 50, 100, 150, 200 and 250 m/min, respectively, using, as inks, Scitex 1007 black ink and 1011 red ink under a drying condition of 2 pass through a microwave drying device (frequency: 2450 MHz, output: 1.7 kW) manufactured by Matsushita Electronic Instrument Co., printing was carried out by two heads to form a solid printing portion corresponding to 4% of the total printable area, a dot printing portion corresponding to 24% of the total printable area and an image data test pattern attached to the printer with a picture frame of 277 mm including a bar code, letters of various fonts, designs and ruled lines, on the rest of the printable area, and the printed images were evaluated by the evaluation methods which will be described hereinafter. The results are shown in Table 2.

The ink jet recording sheets of Examples 4 and 8 and Comparative Examples 1 and 4 prepared as described above, will be described in detail. With respect to these samples, printing was carried out by two heads to form a solid printing portion corresponding to 4% of the total printable area, a dot printing portion corresponding to 24% of the total printable area and on the rest of the printable area, an image data test pattern attached to the printer having a frame of 277 mm including a bar code, letters of various fonts, designs and ruled lines. Depending upon the drying system, a case wherein a microwave drying device manufactured by Matsushita Electronic Instrument Co. was used by the high speed rotary ink jet printing system S6240J manufactured by Uchida Yoko Co., Ltd., was identified with "a", a case wherein a high frequency drier (frequency: 27.12 MHz, output: 7.5 kW) manufactured by Fuji Electronic Industrial Co., Ltd. was used under a condition of 2 pass by a high speed rotary ink jet printer Scitex 6240 manufactured by Miyakoshi Co., Ltd., was identified with "b". Further, a case wherein an ink jet head of Scitex 6240 was installed in a form printing machine manufactured by Taiyo Kikai Ltd., and printing was carried out without using an auxiliary drying device, was identified with "c", and a case wherein a hot air drier Miyamoto Hot Blaster (MS5841: heater 15A) manufactured by Miyamoto Seisakusho was used under a condition of 2 pass, was identified with "d". The results are shown in Table 2.

Ink setting property

While winding up a sheet during printing at various printing speeds under the optimum tension, a silbon paper was pressed against the printed surface for 10 seconds, whereupon the speed at which the silbon paper was not stained, was taken as a printing speed excellent in the ink setting property. As an evaluation standard, a speed of at least 150 m/min is practically required.

PCS value

Using a print contrast meter PCM-II manufactured by Macbeth Co., the PCS values at wavelengths of 633 nm and 660 nm were measured. The PCS value is a value represented by the following formula:

$$PCS = (Rp - Ri)/Rp$$

Rp: Reflectance of the background

Ri: Reflectance of the printed image portion

Water resistance of image

A recorded sheet after printing was immersed in a running water (city water) for 10 seconds whereupon excess water was wiped off, and the sheet was naturally dried. Thereafter, the blotting degree of the recorded image was visually evaluated. Evaluation standards are such that A represents that the water resistance is excellent, B represents that the water resistance is good enough so that there is no practical problem, C represents that there is a practical problem, and D represents that the water resistance is poor.

Bar code readability

The recorded image (bar code) before and after the test for water resistance of image was tested by a bar code tester manufactured by Nihon Denso Co., Ltd. at a wavelength of 660 nm to determine the bar code readability. The evaluation standards were such that IN is an abbreviation of "INSPEC" and represents that the readability is good, and OUT is an abbreviation of "OUT OF SPEC" and represents that the readability is poor.

TABLE 1

| Examples or Comparative Examples | Auxiliary heating device | Cationic resin attaching amount | Ash content | Bristow absorption coefficient |
|---|---|---|---|---|
| Example 1 | Microwave | 1.0 | 12.8 | 1.866 |
| Example 2 | Microwave | 0.1 | 13.0 | 1.894 |
| Example 3 | Microwave | 0.2 | 12.8 | 1.847 |
| Example 4a | Microwave | 1.0 | 13.0 | 1.834 |
| Example 4b | High frequency | 1.0 | 13.0 | 1.834 |
| Example 5 | Microwave | 2.0 | 13.0 | 1.818 |
| Example 6 | Microwave | 1.0 | 13.0 | 1.791 |
| Example 7 | Microwave | 1.0 | 13.0 | 1.763 |
| Example 8a | Microwave | 1.0 | 13.1 | 1.075 |
| Example 8b | High frequency | 1.0 | 13.1 | 1.075 |
| Comparative Example 1c | Nil | 1.0 | 13.0 | 1.834 |
| Comparative Example 1d | Hot air | 1.0 | 13.0 | 1.834 |
| Comparative Example 2 | Microwave | — | 12.9 | 1.870 |
| Comparative Example 3 | Microwave | — | 13.1 | 0.253 |
| Comparative Example 4a | Microwave | — | 6.8 | 0.126 |
| Comparative Example 4b | High frequency | — | 6.8 | 0.126 |
| Comparative Example 5 | Microwave | — | 6.5 | 0.385 |

TABLE 2

| Examples or Comparative Examples | Ink setting property | PCS value 633 nm | PCS value 660 nm | Water resistance of image | Bar code readability Before exposure to water | Bar code readability After exposure to water |
|---|---|---|---|---|---|---|
| Example 1 | 250 | 0.84 | 0.88 | A | IN | IN |
| Example 2 | 250 | 0.83 | 0.85 | B | IN | IN |
| Example 3 | 250 | 0.84 | 0.87 | A | IN | IN |
| Example 4a | 250 | 0.86 | 0.90 | A | IN | IN |
| Example 4b | 250 | 0.86 | 0.90 | A | IN | IN |
| Example 5 | 250 | 0.86 | 0.89 | A | IN | IN |
| Example 6 | 250 | 0.85 | 0.89 | A | IN | IN |
| Example 7 | 250 | 0.86 | 0.90 | A | IN | IN |
| Example 8a | 200 | 0.85 | 0.88 | B | IN | IN |
| Example 8b | 150 | 0.84 | 0.87 | B | IN | IN |
| Comparative Example 1c | 50 | 0.86 | 0.90 | C | OUT | OUT |
| Comparative Example 1d | 100 | 0.86 | 0.89 | C | IN | OUT |
| Comparative Example 2 | 50 | 0.75 | 0.78 | D | OUT | OUT |
| Comparative Example 3 | 50 | 0.75 | 0.78 | D | OUT | OUT |
| Comparative Example 4a | 50 | 0.77 | 0.79 | D | OUT | OUT |
| Comparative Example 4b | 50 | 0.77 | 0.79 | D | OUT | OUT |
| Comparative Example 5 | 50 | 0.78 | 0.80 | D | IN | OUT |

As is evident from the results of Examples 1 to 8 in the above Table 1, an ink jet recording sheet comprising a support and a cationic resin attached thereto, wherein the attaching amount of the cationic resin is from 0.2 to 2.0 g/m$^2$ as a dry attaching amount, preferably an ink jet recording sheet wherein the ash content is at least 7%, more preferably the absorption coefficient according to the Bristow test is at least 1.07 (ml/m$^2$·ms$^{1/2}$), has an excellent ink setting property and maintains the excellent readability of the printed portion even after the test for water resistance of image, in a high speed rotary ink jet printing system employing an auxiliary drying device.

Further, as is evident from Comparative Example 1, in a case where no auxiliary drying device is employed or a hot air drier is used, the ink setting property is inadequate. As is evident from Comparative Examples 2 to 5, the one having no cation resin applied is poor in the water resistance of image even if the absorption coefficient according to the Bristow test is at least 1.07 (ml/m$^2$·ms$^{1/2}$), whereby the readability of the printed portion after the test for water resistance of image, is poor. Further, the one wherein the absorption coefficient according to the Bristow test is less than 1.07 (ml/m$^2$·ms$^{1/2}$), in the high speed rotary ink jet printing system employing an auxiliary drying device, has a poor ink setting property.

EXAMPLES 9 TO 11 AND COMPARATIVE EXAMPLES 6 TO 8

Preparation of Support 1

Added to a pulp slurry comprising 80 parts by LBKP having a freeness of 400 ml csf and 20 parts by manifold white ledger deinked pulp having a freeness of 475 ml csf, were 15 parts of precipitated calcium carbonate light (TP-121, tradename, Okutama Kogyo Co., Ltd.) as a filler, 0.8 part of amphoteric starch (Cato 3210, tradename, manufactured by Starch and Chemical National Co., Ltd.), 0.6 part of aluminum sulfate and 0.02 part of an alkyl ketene dimer type sizing agent (Sizepine K903, tradename, manufactured by Arakawa Chemical Co., Ltd.), and the mixture was sheeted by a Fourdrinier paper machine to obtain Support 1 having a weight of 80 g/m$^2$.

Preparation of Support 2

Support 2 was prepared in the same manner as for Support 1 except that the amount of the alkyl ketene dimer type sizing agent for Support 1 was changed to 0.04 part.

Preparation of Support 3

Support 3 was prepared in the same manner as for Support 1 except that the amount of the alkyl ketene dimer type sizing agent for Support 1 was changed to 0.10 part.

EXAMPLE 9

Attached to Support 2 prepared as described above by means of a size press on machine, were a dimethylamine/epichlorohydrin polycondensation product (Polyfix 601, tradename, manufactured by Showa Highpolymer Co., Ltd.) in an amount of 1.0 g/m² as a dry attaching amount and a starch esterified with phosphoric acid (MS#4600, tradename, manufactured by Nihon Shokuhin Kakou Co., Ltd.) in an amount of 1.5 g/m² as a dry attaching amount, followed by machine calender treatment to obtain an ink jet recording sheet of Example 9. The Bristow absorption coefficient of this sheet was 1.866 (ml/m²·ms$^{1/2}$).

EXAMPLE 10

An ink jet recording sheet of Example 10 was prepared in the same manner as in Example 9 except that Support 2 of Example 9 was changed to Support 3, and the dry attaching amount of the cationic resin was changed to 1.0 g/m². The Bristow absorption coefficient of this sheet was 1.834 (ml/m²·ms$^{1/2}$).

EXAMPLE 11

An ink jet recording sheet of Example 11 was prepared in the same manner as in Example 10 except that 0.05% of a styrene type cationic surface sizing agent (Basoplast 265D, tradename, manufactured by BASF) was added to the size press liquid in Example 10. The Bristow absorption coefficient of this sheet was 1.075 (ml/m²·ms$^{1/2}$).

COMPARATIVE EXAMPLE 6

Attached to Support 1 by means of a size press on machine, was a starch esterified with phosphoric acid (MS#4600, tradename, manufactured by Nihon Shokuhin Kakou Co., Ltd.) in an amount of 1.5 g/m² as a dry attaching amount, followed by machine calender treatment to obtain an ink jet recording sheet of Comparative Example 6. The Bristow absorption coefficient of this sheet was 1.958 (ml/m²·ms$^{1/2}$).

COMPARATIVE EXAMPLE 7

An ink jet recording sheet of Comparative Example 7 was prepared in the same manner as in Comparative Example 6 except that Support 1 in Comparative Example 6 was changed to Support 2. The Bristow absorption coefficient of this sheet was 1.902 (ml/m²·ms$^{1/2}$).

COMPARATIVE EXAMPLE 8

The same sheet as in Example 10 was prepared. The Bristow absorption coefficient of this sheet was 1.834 (ml/m²·ms$^{1/2}$).

The printing and drying methods for the sheets prepared as described above, will be described. With respect to the ink jet recording sheets of Examples 9 to 11 and Comparative Examples 6 and 7, by means of a high speed rotary ink jet printing system S6240J manufactured by Uchida Yoko Co., Ltd. at printing speeds of 50, 100, 150, 200 and 250 m/min, respectively, using, as inks, Scitex 1007 black ink and 1011 red ink under a drying condition of 2 pass through a microwave drier (frequency: 2,450 MHz, output: 1.7 kW) manufactured by Matsushita Electronic Instrument Co., printing was carried out by two heads to form a solid printing portion corresponding to 4% of the total printable area, a dot printing portion corresponding to 24% of the total printable area and an image data test pattern attached to the printer with a frame of 277 mm including a bar code, letters of various fonts, designs and ruled lines on the rest of the printable area, and the printed images were evaluated by the evaluation methods as described below. The results are shown in Table 3.

The ink jet recording sheets of Examples 10 and 11 and Comparative Example 8 prepared as described above, will be described in detail. With respect to these samples, printing was carried out with two heads to form a solid printing portion corresponding to 4% of the total printable area, a dot printing portion corresponding to 24% of the total printable area and on the rest of the printable area, an image data test pattern attached to the printer with a frame of 277 mm including a bar code, letters of various fonts, designs and ruled lines. Depending upon the drying system, a case where a microwave drying device manufactured by Matsushita Electronic Instrument Co. was used by a high speed rotary ink jet printing system S6240J manufactured by Uchida Yoko Co., Ltd., was identified with "a", and a case wherein a high frequency drier (frequency: 27.12 MHz, output: 7.5 kW) manufactured by Fuji Electronic Industrial Co., Ltd. was used under a 2 pass condition by a high speed rotary ink jet printing Scitex 6240, manufactured by Miyakoshi Co., Ltd., was identified with "b". Further, a case wherein an ink jet head of Scitex 6240 was installed in a form printing machine manufactured by Taiyo Kikai Co., Ltd., and printing was carried out without using an auxiliary drying device, was identified with "c". The results are shown in Table 3.

Paper breakage

With respect to the ink jet recording sheets prepared as described above, by means of a high speed rotary ink jet printing system S6240J manufactured by Uchida Yoko Co., Ltd., continuous printing of 4000 m was carried out by two heads at a printing speed of 250 m/min using, as an ink, Scitex 1007 black ink under a drying condition of 2 pass through a microwave drying device (frequency: 2450 MHz, output: 1.7 kW) manufactured by Matsushita Electronic Instrument Co. to form a solid printing portion corresponding to 4% of the total printable area, a dot printing portion corresponding to 24% of the total printable area and on the rest of printable area, an image data test pattern attached to the printer with a frame of 277 mm including a bar code, letters of various fonts, designs and ruled lines, and the number of paper breakage during the printing was counted. The results are shown in Table 3. It is generally desired that no paper breakage occurs.

TABLE 3

|  | No. | Ink setting property | Water resistance of image | Bar code readability | | Number of paper breakage | PCS value | |
| | | | | Before exposure to water | After exposure to water | | 633 nm | 660 nm |
|---|---|---|---|---|---|---|---|---|
| Example | 9 | 250 | A | IN | IN | 0 | 0.84 | 0.88 |
|  | 10a | 250 | A | IN | IN | 0 | 0.86 | 0.90 |
|  | 10b | 250 | A | IN | IN | 0 | 0.86 | 0.90 |
|  | 11a | 200 | B | IN | IN | 0 | 0.85 | 0.88 |
|  | 11b | 150 | B | IN | IN | 0 | 0.84 | 0.87 |
| Comparative | 6 | 250 | D | OUT | OUT | 3 | 0.80 | 0.83 |
| Example | 7 | 250 | D | OUT | OUT | 1 | 0.83 | 0.86 |
|  | 8c | 50 | D | OUT | OUT | 0 | 0.86 | 0.90 |

As is evident from the results in Table 3, the ink jet recording sheets of the present invention had excellent ink setting properties and were excellent in the densities (PCS values) of the bar code printed portions, the water resistance and the anti-paper breakage properties during printing by a high speed rotary ink jet printing system.

In Examples 9 to 11, the Bristow absorption coefficients were within a range of from 1.07 to 1.90, whereby no paper breakage occurred under usual printing conditions, while in Comparative Examples 6 and 7, the Bristow absorption coefficients exceeded 1.90, whereby paper breakage occurred during the printing. In Comparative Example 8, no paper breakage during the printing occurred, but the ink setting properties deteriorated substantially, since no auxiliary drying device was used.

EXAMPLES 12 TO 16 AND COMPARATIVE EXAMPLES 9 TO 12

Preparation of Support 1

Added to a pulp slurry comprising 80 parts of LBKP having a freeness of 400 ml csf and 20 parts of manifold white ledger deinked pulp having a freeness of 475 ml csf, were 15 parts of precipitated calcium carbonate light (TP-121, tradename, manufactured by Okutama Kogyo Co., Ltd.) as a filler, 0.8 part of amphoteric starch (Cato 3210, tradename, manufactured by National Starch and Chemical Co., Ltd.), 0.6 part of aluminum sulfate and 0.04 part of an alkyl ketene dimer type sizing agent (Sizepine K903, tradename, manufactured by Arakawa Chemical Co., Ltd.), and the mixture was sheeted by a Fourdrinier paper machine to obtain Support 1 having a weight of 80 g/m$^2$.

Preparation of Support 2

Support 2 was prepared in the same manner as for Support 1 except that the amount of the alkyl ketene dimer type sizing agent for Support 1 was changed to 0.10 part.

EXAMPLE 12

Attached to Support 2 prepared as described above by means of a size press on machine, were a dimethylamine/epichlorohydrin polycondensation product (Polyfix 601, tradename, manufactured by Showa Highpolymer Co., Ltd.) as a cationic resin in an amount of 1.0 g/m$^2$ as a dry attaching amount and a starch esterified with phosphoric acid (MS#4600, tradename, manufactured by Nihon Shokuhin Kakou Co., Ltd.) in an amount of 1.5 g/m$^2$ as a dry attaching amount, followed by machine calender treatment to obtain an ink jet recording sheet of Example 12.

EXAMPLE 13

An ink jet recording sheet of Example 13 was prepared in the same manner as in Example 12 except that the dry attaching amount of the cationic resin in Example 12 was changed to 2.0 g/m$^2$.

EXAMPLE 14

An ink jet recording sheet of Example 14 was prepared in the same manner as in Example 12 except that the cationic resin in Example 12 was changed to an acrylamide/diallylamine copolymer (Sumirez Resin 1001, tradename, manufactured by Sumitomo Chemical Co., Ltd.).

EXAMPLE 15

An ink jet recording sheet of Example 15 was prepared in the same manner as in Example 12 except that the cationic resin in Example 12 was changed to a polyvinyl amine copolymer (Himacs SC-700, tradename, manufactured by Hymo Co., Ltd.).

EXAMPLE 16

An ink jet recording sheet of Example 16 was prepared in the same manner as in Example 12 except that 0.05% of a styrene type cationic surface sizing agent (Basoplast 265D, tradename, manufactured by BASF) was added to the size press liquid in Example 12.

COMPARATIVE EXAMPLE 9

Attached to Support 1 by means of a size press on machine, was a starch esterified with phosphoric acid (MS#4600, tradename, manufactured by Nihon Shokuhin Kakou Co., Ltd.) in an amount of 1.5 g/m$^2$ as a dry attaching amount, followed by machine calender treatment, to obtain an ink jet recording sheet of Comparative Example 9.

COMPARATIVE EXAMPLE 10

An ink jet recording sheet of Comparative Example 10 was prepared in the same manner as in Comparative Example 9 except that Support 1 in Comparative Example 9 was changed to Support 2.

COMPARATIVE EXAMPLE 11

Commercially available Mitsubishi OCR paper (72) was used. This commercial product had no cationic resin applied to the paper surface.

COMPARATIVE EXAMPLE 12

Commercially available Mitsubishi Diaform paper (70) was used. This commercial product had no cationic resin applied to the paper surface.

The printing and drying methods for the sheets prepared as described above, will be described. With respect to the ink jet recording sheets of Examples 12 to 16 and Comparative Examples 9 to 12, by means of a high speed rotary ink jet printing system S6240J manufactured by Uchida Yoko Co., Ltd., printing was carried out by two heads at printing speeds of 50, 100, 150, 200 and 250 m/min, respectively, using, as inks, Scitex 1007 black ink and 1011 red ink under a drying condition of 2 pass through a microwave drying device (frequency: 2450 MHz, output: 1.7 kW) manufactured by Matsushita Electronic Instrument Co., to form a solid printing portion corresponding to 4% of the total printable area, $$MDR = R_L - R_D \ (\%)$$

RL: The minimum reflectance (%) of the portion where a 10 white bar i.e. a gap quiet zone between characters, is formed.

RD: The minimum reflectance (%) of a black bar.

In a case where a nominal fine element width X<1.020 (mm), the MRD value is usually required to be at least 37.5%.

TABLE 4

|  | No. | ISP* | PCS value 633 nm | PCS value 660 nm | Water resistance of image | Bar code readability Before exposure to water | Bar code readability After exposure to water | MRD value | Number of paper breakage |
|---|---|---|---|---|---|---|---|---|---|
| Example | 12a | 250 | 0.86 | 0.90 | A | IN | IN | 48 | 0 |
|  | 12b | 250 | 0.86 | 0.90 | A | IN | IN | 49 | 0 |
|  | 13 | 250 | 0.86 | 0.89 | A | IN | IN | 41 | 0 |
|  | 14 | 250 | 0.85 | 0.89 | A | IN | IN | 39 | 0 |
|  | 15 | 250 | 0.86 | 0.90 | A | IN | IN | 38 | 0 |
|  | 16 | 200 | 0.85 | 0.88 | B | IN | IN | 42 | 0 |
| Comparative | 9 | 250 | 0.75 | 0.78 | D | OUT | OUT | 25 | 3 |
| Example | 10 | 50 | 0.75 | 0.78 | D | OUT | OUT | 33 | 1 |
|  | 11a | 50 | 0.77 | 0.79 | D | OUT | OUT | 29 | 0 |
|  | 11b | 50 | 0.77 | 0.79 | D | OUT | OUT | 29 | 0 |
|  | 12 | 50 | 0.78 | 0.80 | D | IN | OUT | 32 | 0 |

*ISP: Ink setting property a dot printing portion corresponding to 24% of the total printable area and on the rest of printable area, an image data test pattern attached to the printer with a frame of 277 mm including a bar code, letters of various fonts, designs and ruled lines, and evaluation was carried out by the following evaluation method. The results are shown in Table 4.

The ink jet recording sheets of Example 12 and Comparative Example 11 prepared as described above, will be described in detail. With respect to these samples, printing was carried out by two heads to form a solid printing portion corresponding to 4% of the total printable area, a dotted printing portion corresponding to 24% of the total printable area, and on the rest of printable area, an image data test pattern attached to the printer with a frame of 277 mm including a bar code, letters of various fonts, designs and ruled lines. Depending upon the drying system, a case wherein a microwave drying device manufactured by Matsushita Electronic Instrument Co. was used by a high speed rotary ink jet printing system S6240J manufactured by Uchida Yoko Co., Ltd., was identified with "a", and a case wherein a high frequency drier (frequency: 27.12 MHz, output: 7.5 kW) manufactured by Fuji Electronic Industrial Co., Ltd. was used under a 2 pass condition by a high speed rotary ink jet printer Scitex 6240 manufactured by Miyakoshi Co., Ltd., was identified by "b". The results are shown in Table 4.

Optical scanability

With respect to the ink jet recording sheets printed as described above, MRD (minimum reflection difference) values were measured for the purpose of confirming the optical scanability in detail, in addition to the PCS values at wavelengths of 633 nm and 660 nm, by means of 5 Macbeth print contrast meter PCM-II. The minimum reflection difference MRD is a value represented by the following formula.

As is evident from the results in Table 4, the ink jet recording sheets of the present invention had excellent ink setting properties and were excellent in the densities (PCS values) of the bar code printed portions, the optical scanability (MRD value) and the water resistance.

In Examples 12 to 16, a cationic resin was attached to the support, while in Comparative Examples 9 to 12, no cationic resin was attached to the support, whereby the densities of the bar code printed portions were low, and the MRD values as an index for evaluation of the optical scanability were lower than the standard value.

EXAMPLES 17 TO 20 AND COMPARATIVE EXAMPLES 13 TO 15

Preparation of Support 1

Added to a pulp slurry comprising 80 parts of LBKP having a freeness of 400 ml csf and 20 parts of manifold white ledger deinked pulp having a freeness of 475 ml csf, were 15 parts of precipitated calcium carbonate light (TP-121, tradename, manufactured by Okutama Kogyo Co., Ltd.) as a filler, 0.8 part of amphoteric starch (Cato 3210, tradename, manufactured by National Starch and Chemical Co., Ltd.), 0.6 part of aluminum sulfate and 0.10 part of an alkyl ketene dimer type sizing agent (Sizepine K903, tradename, manufactured by Arakawa Chemical Co., Ltd.), and the mixture was sheeted by a Fourdrinier paper machine to obtain Support 1 having a weight of 80 g/m².

EXAMPLE 17

Attached to both sides of Support 1 prepared as described above by means of a size press on machine, were a dimethylamine/epichlorohydrin polycondensation product (Polyfix 601, tradename, manufactured by Showa Highpolymer Co., Ltd.) as a cationic resin in an amount of 1.0 g/m² as a dry attaching amount and an aqueous dispersion having a solid content concentration of 6% containing as the main component a starch esterified with phosphoric acid (MS#4600, tradename, manufactured by Nihon Shokuhin Kakou Co., Ltd.) in an amount of 1.5 g/m² per side as a dry attaching amount of solid content, followed by machine calender treatment to obtain an ink jet recording sheet of Example 17.

EXAMPLE 18

An ink jet recording sheet of Example 18 was prepared in the same manner as in Example 17 except that the solid content concentration of the aqueous dispersion used in Example 17 was changed to 15%, the cationic resin attaching apparatus was changed from the size press on machine to a gate roll coater on machine, and the cationic resin was coated on both sides of the sheet so that the dry attaching amount of solid content became 2.0 g/m² per side.

EXAMPLE 19

The ink jet recording sheet of Example 19 was prepared in the same manner as in Example 18 except that the cationic resin attaching apparatus in Example 18 was changed from the size press on machine to a pre-metering transfer roll coater (Sym-Sizer, manufactured by Valmet Paper Machinery, Inc.) on machine for coating both sides of the sheet.

EXAMPLE 20

An ink jet recording sheet of Example 20 was prepared in the same manner as in Example 19 except that the cationic resin attaching apparatus in Example 19 was changed from the pre-metering transfer roll coater (Sym-Sizer, manufactured by Valmet Paper Machinery, Inc.) on machine to an apparatus of the same type except that the metering system was changed from a rod to a blade (Blade metering size press, manufactured by Beloit Co.) for coating both sides of the sheet.

COMPARATIVE EXAMPLE 13

Attached to a felt surface of Support 1 by means of a blade coater in one step, was an aqueous dispersion having a solid content concentration of 15% containing as the main component a starch esterified with phosphoric acid (MS#4600, tradename, manufactured by Nihon Shokuhin Kakou Co., Ltd.) in an amount of 1.5 g/m² per side as a dry attaching amount of solid content, followed by machine calender treatment, to obtain an ink jet recording sheet of Comparative Example 13.

COMPARATIVE EXAMPLE 14

An ink jet recording sheet of Comparative Example 14 was prepared in the same manner as in Comparative Example 13 except that the blade coater apparatus on machine in Comparative Example 13 was changed to a rod coater to attach the dispersion to the felt surface of the sheet.

COMPARATIVE EXAMPLE 15

An ink jet recording sheet of Comparative Example 14 was prepared in the same manner as in Comparative Example 13 except that the blade coater apparatus on machine in Comparative Example 13 was changed to an air knife coater to attach the dispersion to the felt surface of the sheet.

The printing and drying methods for the sheets prepared as described above, will be described. With respect to the ink jet recording sheets of Examples 17 to 20 and Comparative Examples 13 to 15, by means of a high speed rotary ink jet printing system S6240J manufactured by Uchida Yoko Co., Ltd., printing was carried out by two heads at printing speeds of 50, 100, 150, 200 and 250 m/min, respectively, using, as inks, Scitex 1007 black ink and 1011 red ink under a drying condition of 2 pass through a microwave drying device (frequency: 2450 MHz, output: 1.7 kW) manufactured by Matsushita Electronic Instrument Co., to form a solid printing portion corresponding to 4% of the total printable area, a dot printing portion corresponding to 24% of the total printable area and on the rest of the printable area, an image data test pattern attached to the printer with a frame of 277 mm including a bar code, letters of various fonts, designs and ruled lines, and evaluation was carried out by the following evaluation method. The results are shown in Table 5.

The ink jet recording sheets of Example 17 and Comparative Example 15 prepared as described above, will be described in detail. With respect to these samples, printing was carried out by two heads to form a solid printing portion corresponding to 4% of the total printable area, a dot printing portion corresponding to 24% of the total printable area and on the rest of the printable area, an image data test pattern attached to the printer with a frame of 277 mm including a bar code, letters of various fonts, designs and ruled lines. Depending upon the drying system, a case wherein a microwave drying device manufactured by Matsushita Electronic Instrument Co. was used by a high speed rotary ink jet printing system S6240J manufactured by Uchida Yoko Co., Ltd., was identified with "a", and a case wherein a high frequency drier (frequency; 27.12 MHz, output: 7.5 kW) manufactured by Fuji Electronic Industrial Co., Ltd. was used under a 2 pass condition by a high speed rotary ink jet printer Scitex 6240 manufactured by Miyakoshi Co., Ltd., was identified with "b". The results are shown in Table 5.

Perfect printability (Printability on both sides)

With respect to the ink jet recording sheet prepared as described above, for the purpose of evaluating the printability on both sides of the sheet, printing was carried out on both the felt side and the wire side (the front side and the rear side) of a base sheet, whereby the presence or absence of a difference between the front and rear sides was evaluated. ⊙ represents that there was no difference between the front and rear sides, ○ represents that there was no practical problem, Δ represents that there was a difference observed to some extent between the front and rear sides, and × represents that the difference was so large that the product was not practically useful.

TABLE 5

|  | No. | ISP* | PCS value 633 nm | PCS value 660 nm | Water resistance of image | Bar code readability Before exposure to water | Bar code readability After exposure to water | MRD value | Number of paper breakage | Perfect printability |
|---|---|---|---|---|---|---|---|---|---|---|
| Example | 17a | 250 | 0.86 | 0.90 | A | IN | IN | 48 | 0 | ⊚ |
|  | 17b | 250 | 0.86 | 0.90 | A | IN | IN | 49 | 0 | ⊚ |
|  | 18 | 250 | 0.85 | 0.88 | A | IN | IN | 50 | 0 | ○ |
|  | 19 | 250 | 0.86 | 0.90 | A | IN | IN | 47 | 0 | ⊚ |
|  | 20 | 250 | 0.85 | 0.89 | A | IN | IN | 45 | 0 | ○ |
| Comparative | 13 | 250 | 0.75 | 0.78 | D | OUT | OUT | 33 | 0 | X |
| Example | 14 | 50 | 0.75 | 0.78 | D | OUT | OUT | 33 | 0 | X |
|  | 15a | 50 | 0.77 | 0.79 | D | OUT | OUT | 30 | 0 | X |
|  | 15b | 50 | 0.77 | 0.79 | D | OUT | OUT | 30 | 0 | X |

*ISP: Ink setting property

As is evident from the results in Table 5, the ink jet recording sheets of the present invention had excellent ink setting properties and were excellent in the densities of the bar code printed portions, the readabilities, the water resistance and the perfect printability.

In Examples 17 to 20, a size press, a gate roll or a pre-metering transfer roll coater on machine was used as the apparatus for attaching the cationic resin to the support, and coating was carried out in one step, while in Comparative Examples 13 to 15, a blade coater, a rod coater or an air knife coater was used as the apparatus for attaching the aqueous dispersion containing a starch esterified with phosphoric acid to the support, whereby the perfect printability of the sheet can not be secured by coating in one step.

As described in the foregoing, the ink jet recording sheet of the present invention is an ink jet recording sheet capable of being printed on both sides, which is suitable for use in a high speed rotary ink jet printing system employing an auxiliary drying device and which comprises a support and a cationic resin attached thereto, and further by defining the dry attaching amount of solid content of the cationic resin and the ash content of a base paper, and further preferably by defining the absorption coefficient according to the Bristow test, the ink setting property and the bar code readability will be excellent, and the excellent readability of the printed portion can be maintained even under a high humidity condition or even when the printed portion is exposed to water for some reason.

What is claimed is:

1. An ink jet recording sheet useful in a high speed rotary ink jet recording system employing an auxiliary drying device of a dielectric heating type, said sheet comprising plain paper as a support and a cationic resin in an amount of 0.2 to 2 g/m$^2$ as an ink receiving component attached to both surfaces of the support in one step by use of a size press, a gate roll coater or pre-metering transfer roll coater, wherein said support performs an ink receiving function.

2. The ink jet recording sheet according to claim 1, which contains precipitated calcium carbonate light as a filler and which has an ash content of at least 7% as measured by a method in accordance with JIS P8128 except that the incineration temperature is 500° C.

3. The ink jet recording sheet according to claim 1, on which a printed image has a PCS value of at least 0.80 at a wavelength of from 600 to 700 nm.

4. The ink jet recording sheet according to claim 1, which has an absorption coefficient according to the Bristow test of at least 1.07 (ml/m$^2$•ms$^{1/2}$).

5. The ink jet recording sheet according to claim 1, wherein the cationic resin is at least one member selected from the group consisting of a dimethyl amine/epichlorohydrin polycondensation product, an acrylamide/diallylamine copolymer, a polyvinyl amine copolymer, and a composition comprising dicyandiamide and dimethyldiallyl ammonium chloride.

6. The ink jet recording sheet according to claim 1, wherein the cationic resin is attached to the support by a size press or a gate roll coater which is installed in a paper machine.

7. An ink jet recording sheet useful in a high speed rotary ink jet recording system employing an auxiliary drying device of a dielectric heating type, said sheet comprising plain paper as a support and a cationic resin in an amount of 0.2 to 2 g/m$^2$ as an ink receiving component attached to both surfaces of the support in one step by use of a size press, a gate roll coater or pre-metering transfer roll coater, and having an absorption coefficient according to the Bristow test of from 1.07 to 1.90 (ml/m$^2$•ms$^{1/2}$), wherein said support performs an ink receiving function.

8. The ink jet recording sheet according to claim 7, which contains precipitated calcium carbonate light as a filler and which has an ash content of at least 7% as measured by a method in accordance with JIS P8128 except that the incineration temperature is 500° C.

9. The ink jet recording sheet according to claim 7, which a printed image has a PCS value of at least 0.80 at a wavelength of from 600 to 700 nm.

10. The ink jet recording sheet according to claim 7, wherein the cationic resin is at least one member selected from the group consisting of a dimethyl amine/epichlorohydrin polycondensation product, an acrylamide/diallylamine copolymer, a polyvinyl amine copolymer, and a composition comprising dicyandiamide and dimethyldiallyl ammonium chloride.

11. The ink jet recording sheet according to claim 7, wherein the cationic resin is attached to the support by a size press or a gate roll coater which is installed in a paper machine.

12. An ink jet recording sheet useful in a high speed rotary ink jet recording system employing an auxiliary drying device of a dielectric heating type, said sheet comprising plain paper as a support and a cationic resin in an amount of 0.2 to 2 g/m$^2$ as an ink receiving component attached to both surfaces of the support in one step by use of a size press, a gate roll coater or pre-metering transfer roll coater, and having an absorption coefficient according to the Bristow test of from 1.07 to 1.90 (ml/m$^2$•ms$^{1/2}$), and a printed image on the sheet having a PCS value of at least 0.85 at a wavelength of from 600 to 700 nm, wherein said support performs an ink receiving function.

13. The ink jet recording sheet according to claim 12, which contains precipitated calcium carbonate light as a filler and which has an ash content of at least 7% as measured by a method in accordance with JIS P8128 except that the incineration temperature is 500° C.

14. The ink jet recording sheet according to claim 12, wherein the cationic resin is at least one member selected from the group consisting of a dimethyl mine/epichlorohydrin polycondensation product, an acrylamide/diallylamine copolymer, a polyvinyl amine copolymer, and a composition comprising dicyandiamide and dimethyldiallyl ammonium chloride.

15. An ink jet recording sheet useful in a high speed rotary ink jet recording system employing an auxiliary drying device of a dielectric heating type, said sheet comprising plain paper as a support and a cationic resin in an amount of 0.2 to 2 g/m² as an ink receiving component attached to both surfaces of the support in one step by use of a size press, a gate roll coater or pre-metering transfer roll coater, and having an absorption coefficient according to the Bristow test of from 1.07 to 1.90 (ml/m²•ms$^{1/2}$), and a printed image on the sheet having a PCS value of at least 0.85 at a wavelength of from 600 to 700 nm, wherein the cationic resin is attached to both sides of the support by a size press or a gate roll coater installed in the paper machine, wherein said support performs an ink receiving function.

16. The ink jet recording sheet according to claim 15, which contains precipitated calcium carbonate light as a filler and which has an ash content of at least 7% as measured by a method in accordance with JIS P8128 except that the incineration temperature is 500° C.

* * * * *